(12) United States Patent
Lee et al.

(10) Patent No.: US 12,102,008 B2
(45) Date of Patent: Sep. 24, 2024

(54) THERMOELECTRIC ELEMENT

(71) Applicant: LG INNOTEK CO., LTD., Seoul (KR)

(72) Inventors: Se Woon Lee, Seoul (KR); Jong Hyun Kim, Seoul (KR); Young Sam Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 115 days.

(21) Appl. No.: 17/916,210

(22) PCT Filed: Mar. 25, 2021

(86) PCT No.: PCT/KR2021/003702
§ 371 (c)(1),
(2) Date: Sep. 30, 2022

(87) PCT Pub. No.: WO2021/201495
PCT Pub. Date: Oct. 7, 2021

(65) Prior Publication Data
US 2023/0165147 A1 May 25, 2023

(30) Foreign Application Priority Data
Apr. 1, 2020 (KR) .................. 10-2020-0039991

(51) Int. Cl.
*H10N 10/17* (2023.01)
*H10N 10/817* (2023.01)

(52) U.S. Cl.
CPC .......... *H10N 10/817* (2023.02); *H10N 10/17* (2023.02)

(58) Field of Classification Search
CPC .................. H10N 10/817; H10N 10/17
See application file for complete search history.

(56) References Cited

U.S. PATENT DOCUMENTS

| 9,947,854 B2* | 4/2018 | Cho ................. H10N 10/13 |
| 2010/0101620 A1 | 4/2010 | Tanaka |
| 2013/0014516 A1 | 1/2013 | Yang et al. |
| 2016/0181500 A1 | 6/2016 | Lin et al. |
| 2021/0050504 A1* | 2/2021 | Roh ................. H10N 10/817 |

FOREIGN PATENT DOCUMENTS

| JP | 2002-324922 A | 11/2002 |
| JP | 2010-109054 A | 5/2010 |
| JP | 2016-119450 A | 6/2016 |
| KR | 10-2013-0009442 A | 1/2013 |
| KR | 10-2019-0088256 A | 7/2019 |
| KR | 20190088256 | * 7/2019 |

* cited by examiner

*Primary Examiner* — Jayne L Mershon
(74) *Attorney, Agent, or Firm* — Birch, Stewart, Kolasch & Birch, LLP

(57) ABSTRACT

Provided according to an embodiment is a thermoelectric element comprising: a first insulating part; multiple first electrodes disposed on the first insulating part; a second electrode disposed above the first electrodes; a first conductive semiconductor structure and a second conductive semiconductor structure disposed while being spaced each other between the first electrodes and the second electrode; and a second insulating part disposed on the second electrode, wherein the first insulating part comprises first protrusions protruding toward the first electrodes, and the second insulating part comprises a second protrusion protruding toward the second electrode.

8 Claims, 10 Drawing Sheets

[FIG. 1]
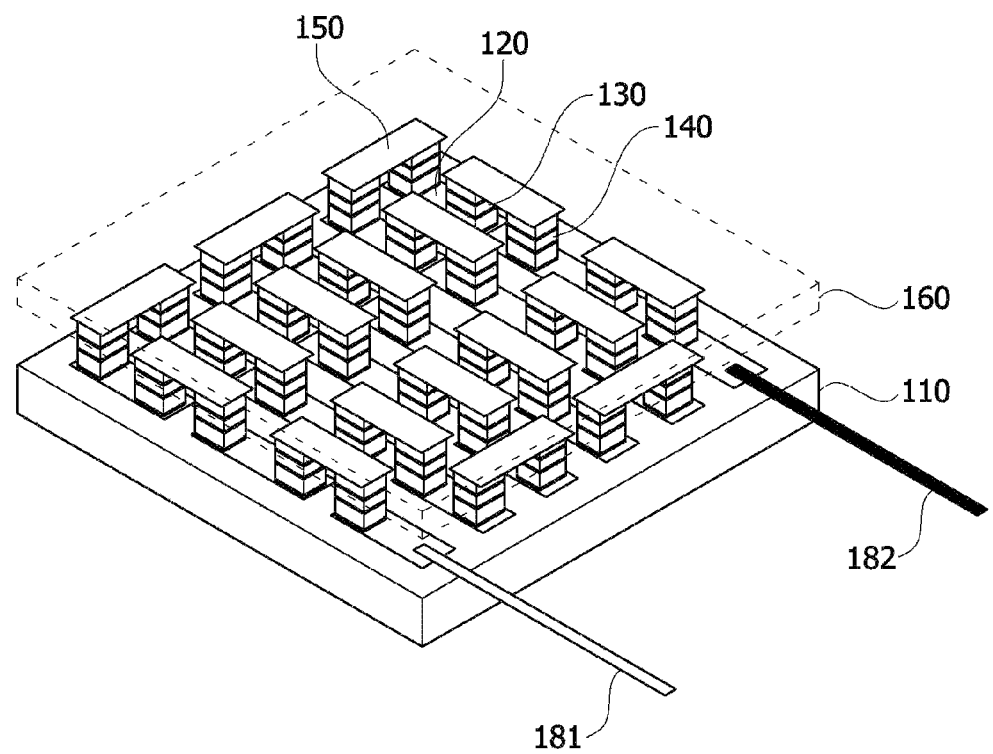

[FIG. 2]
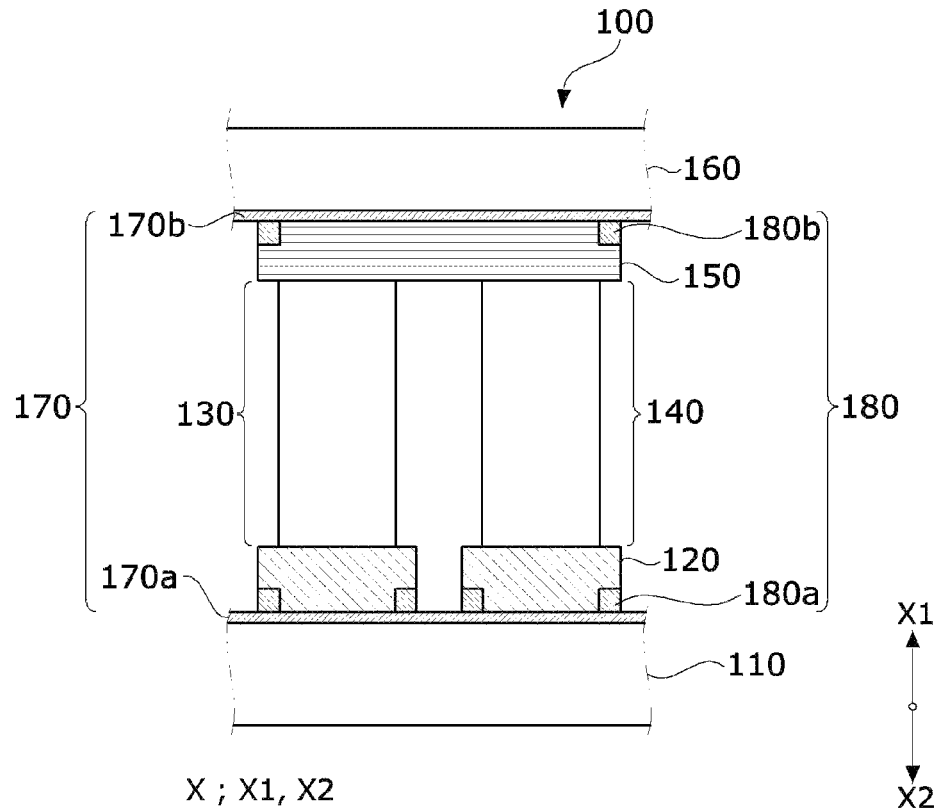
[FIG. 3]
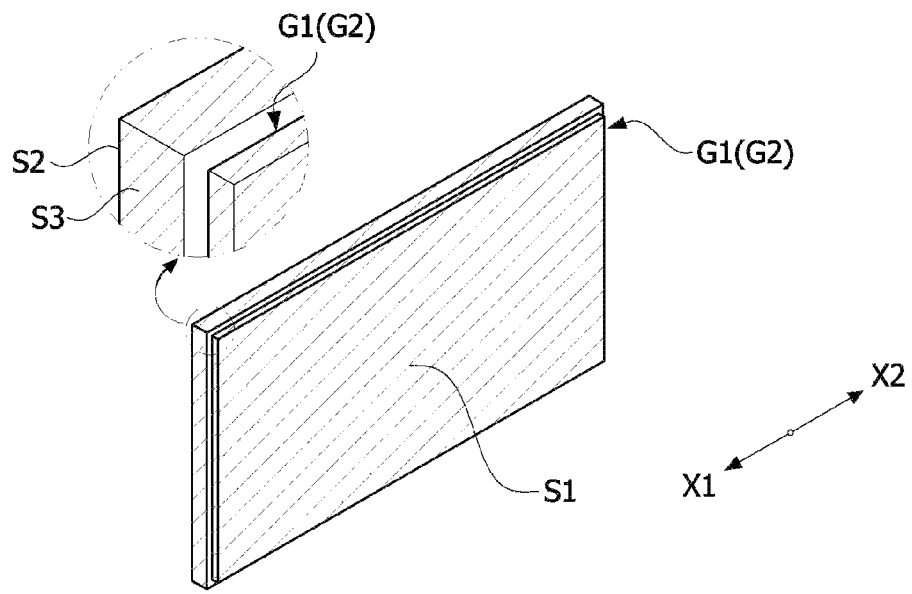

[FIG. 4]
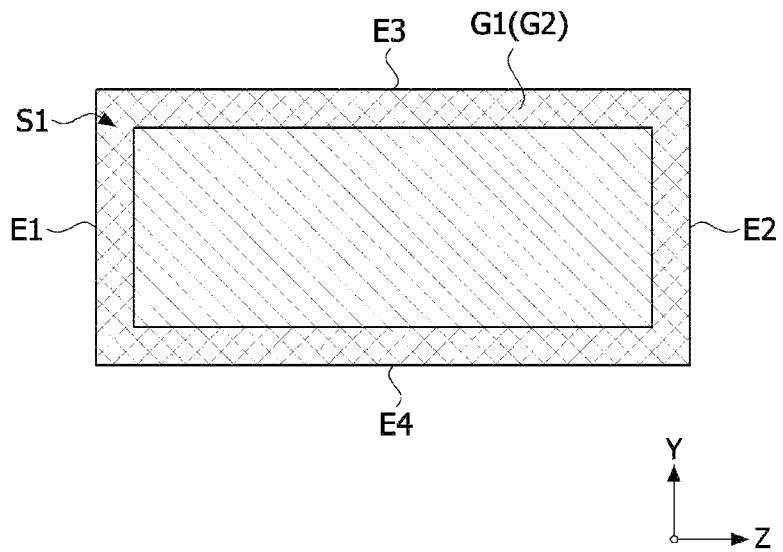
[FIG. 5]
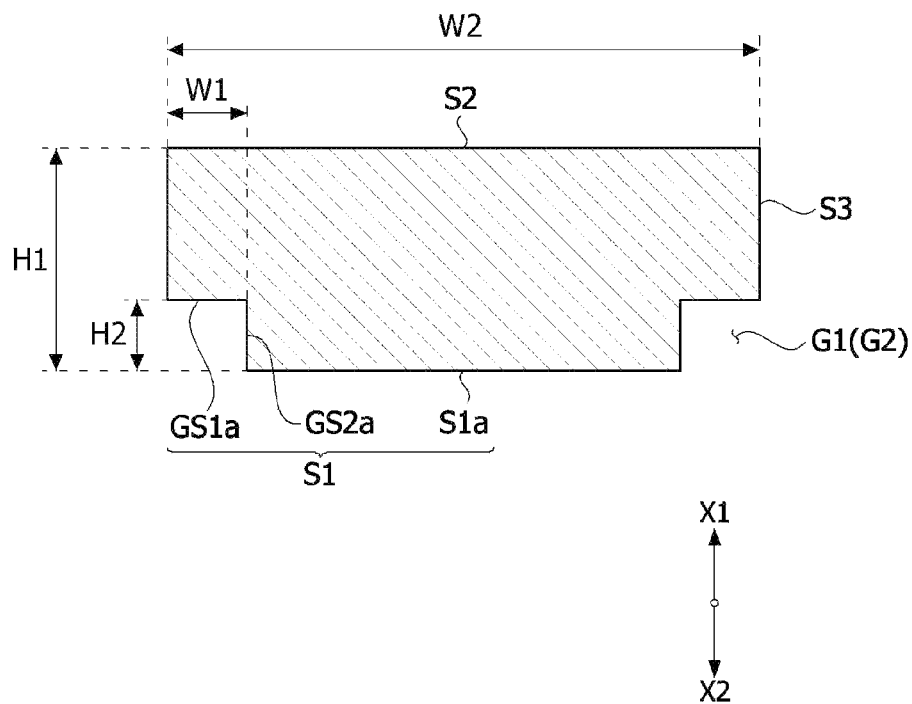

[FIG. 6]
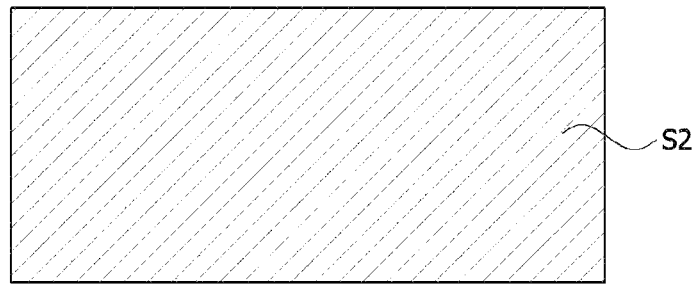
[FIG. 7]
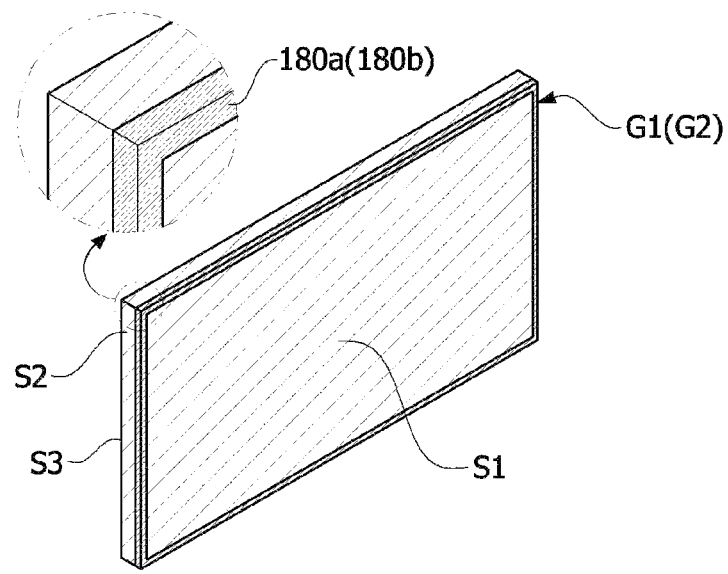
[FIG. 8]
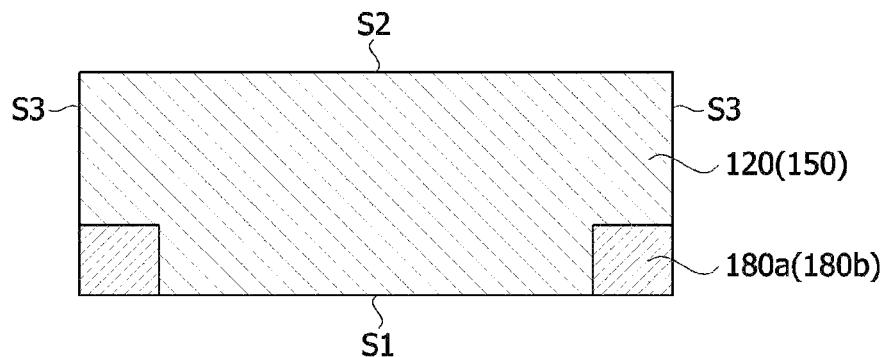

[FIG. 9]
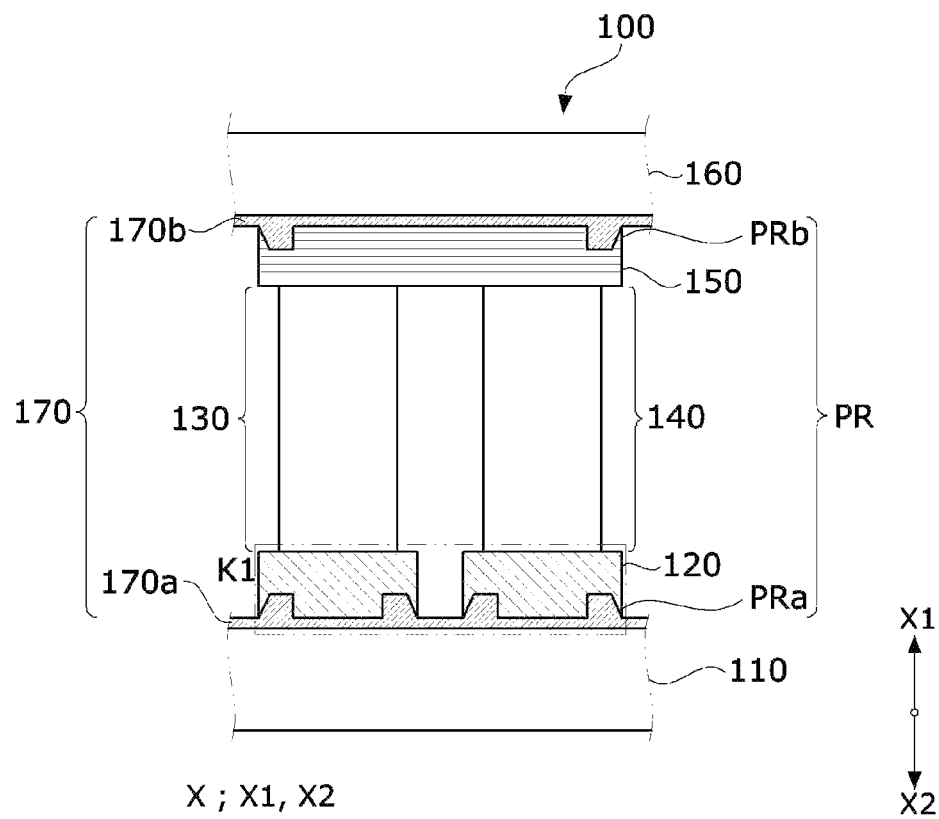
[FIG. 10]
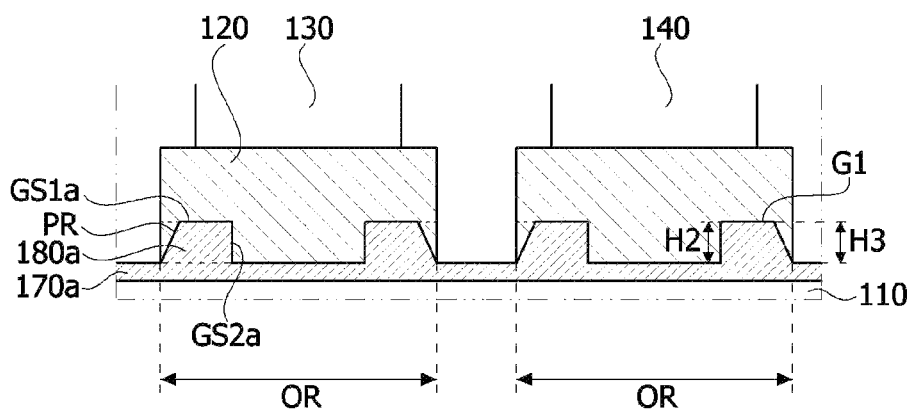

[FIG. 11]
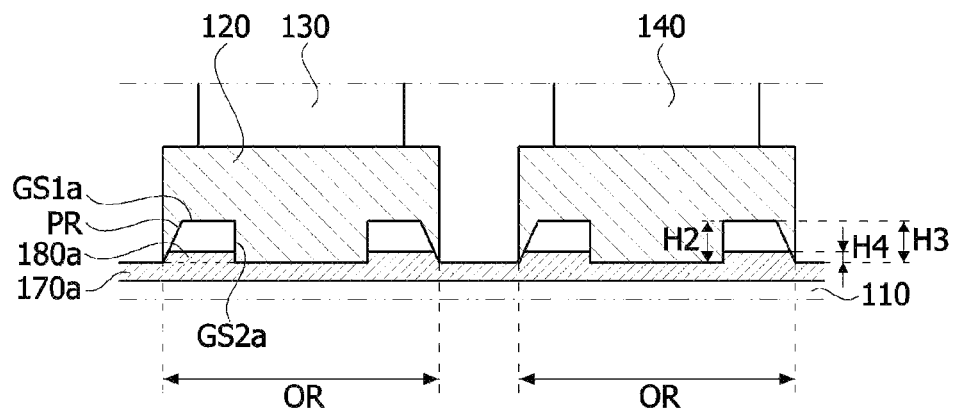
[FIG. 12]
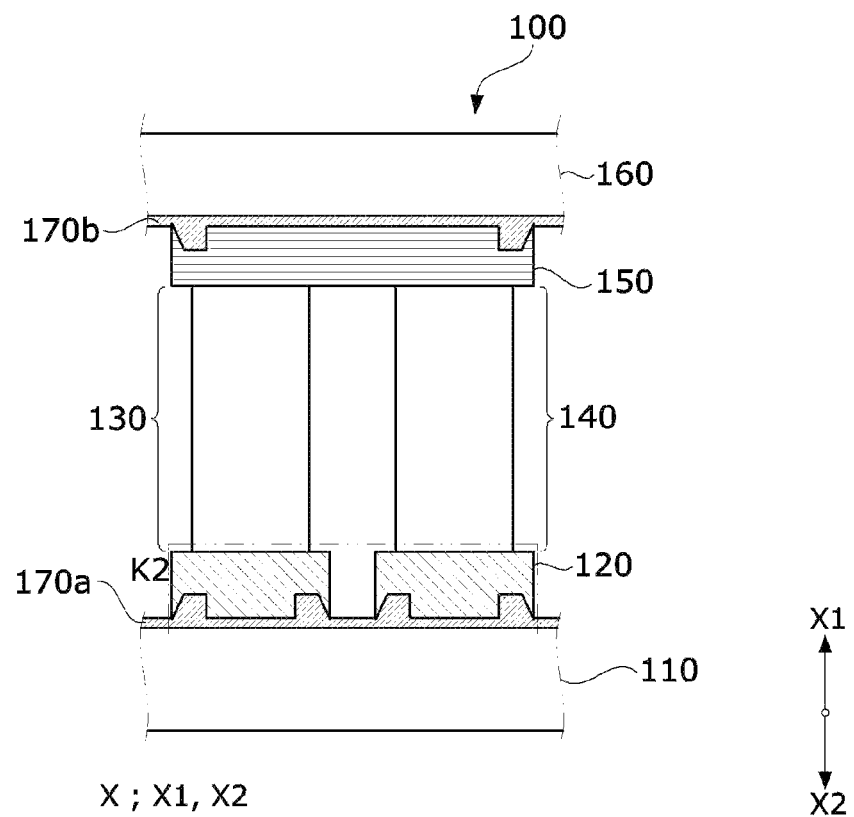

[FIG. 13]
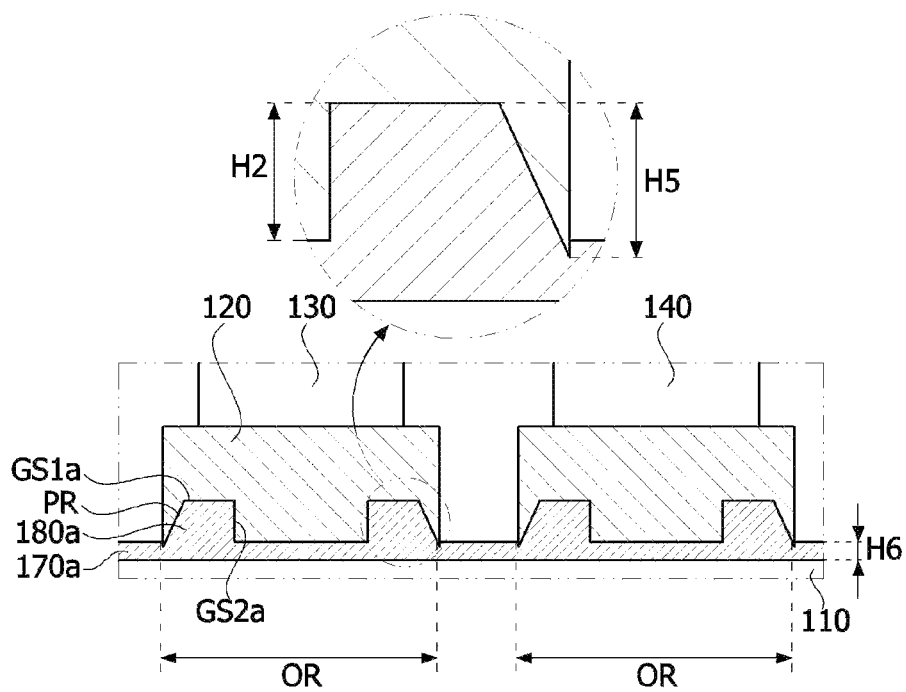
[FIG. 14]
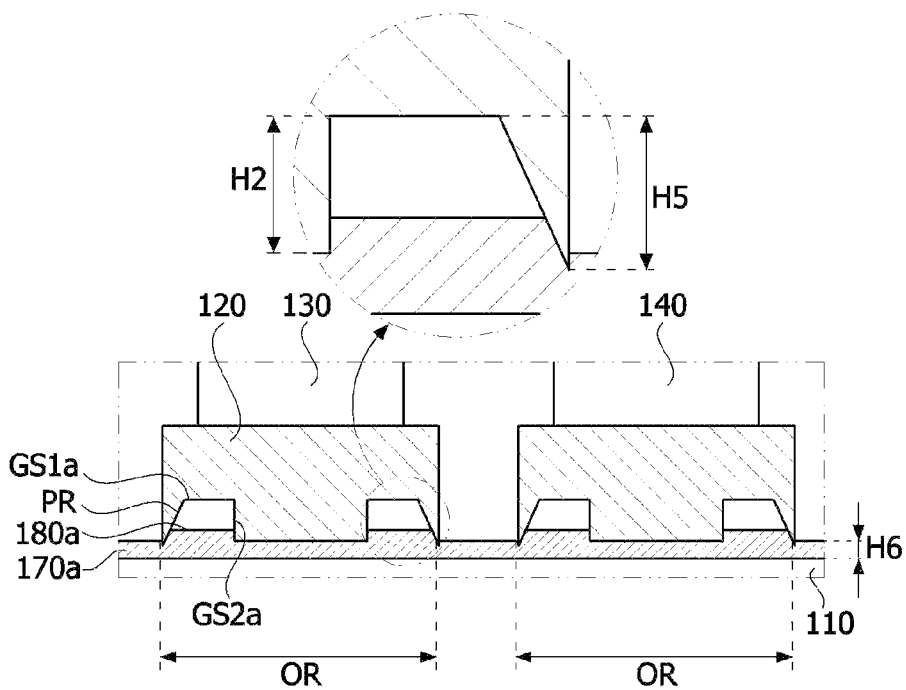

[FIG. 15]
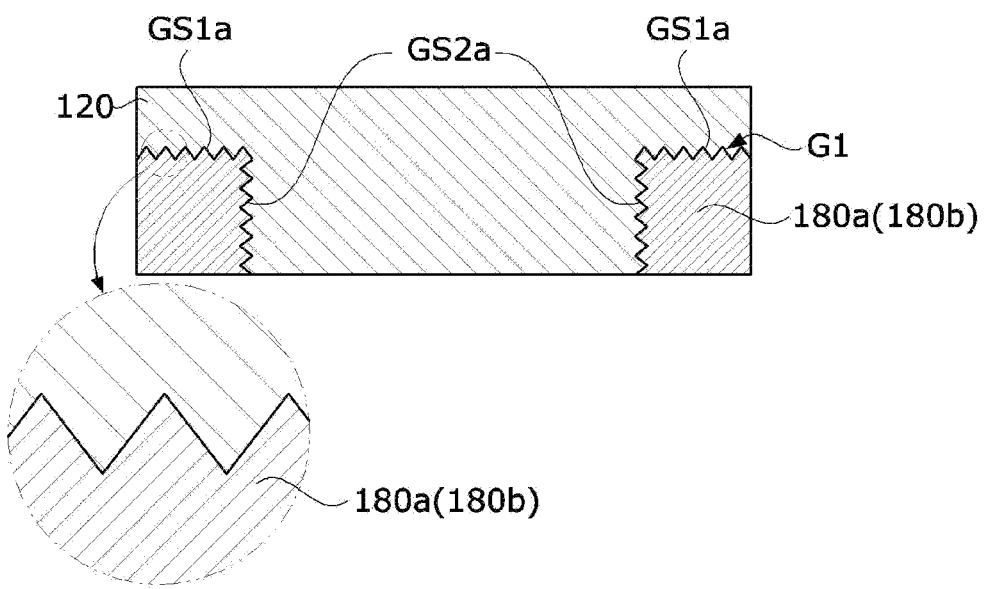
[FIG. 16a]
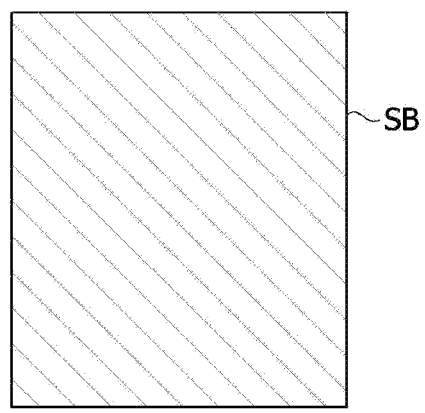

[FIG. 16b]
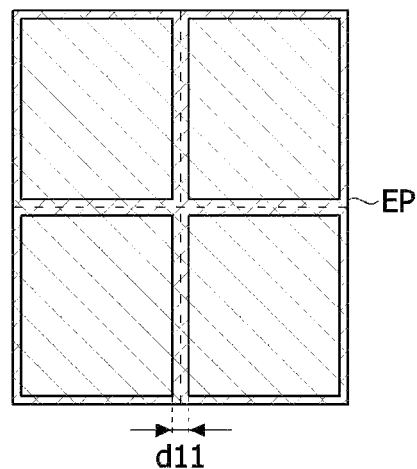
[FIG. 16c]
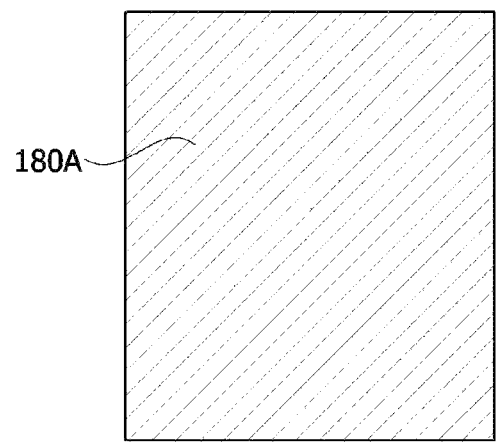

[FIG. 16d]
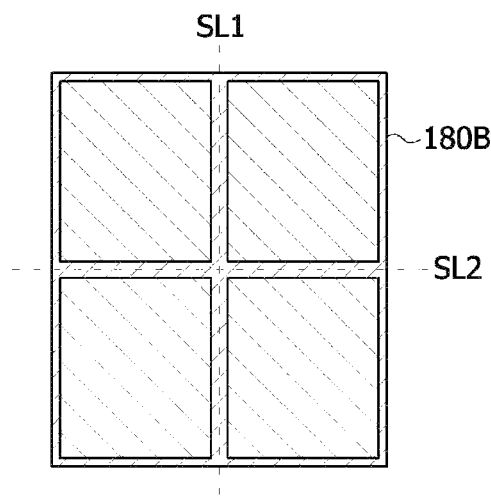
[FIG. 16e]
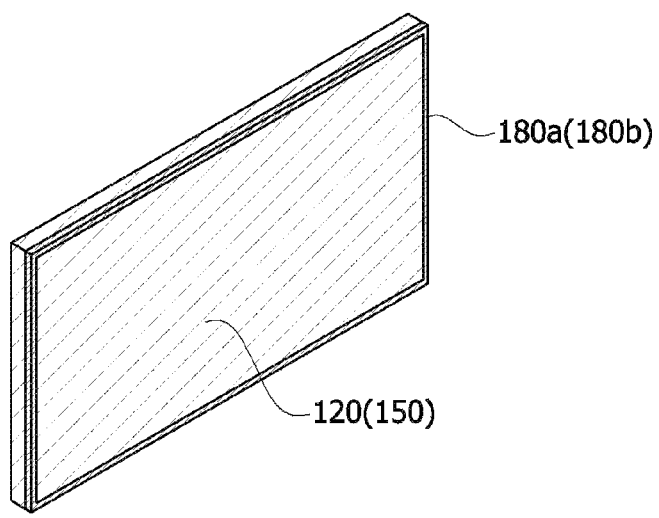

THERMOELECTRIC ELEMENT

CROSS REFERENCE TO RELATED APPLICATIONS

This application is the National Phase of PCT/KR2021/003702 filed on Mar. 25, 2021, which claims priority under 35 U.S.C. § 119(a) to Patent Application No. 10-2020-0039991 filed in the Republic of Korea on Apr. 1, 2020, all of which are hereby expressly incorporated by reference into the present application.

TECHNICAL FIELD

The present invention relates to a thermoelectric element, and more specifically, to a structure of an electrode disposed on a substrate.

BACKGROUND ART

A thermoelectric effect is a direct energy conversion phenomenon between heat and electricity that occurs due to the movement of electrons and holes in a material.

A thermoelectric element is generally referred to as an element using a thermoelectric effect and has a structure in which P-type thermoelectric materials and N-type thermoelectric materials are disposed between and bonded to metal electrodes to form PN junction pairs.

Thermoelectric elements may be divided into elements using a change in electrical resistance depending on a change in temperature, elements using the Seebeck effect in which an electromotive force is generated due to a difference in temperature, elements using the Peltier effect in which heat absorption or heating occurs due to a current, and the like.

Thermoelectric elements have been variously applied to home appliances, electronic components, communication components, and the like. As an example, thermoelectric elements may be applied to cooling apparatuses, heating apparatuses, power generation apparatuses, and the like. Therefore, the demand for the thermoelectric performance of the thermoelectric element is gradually increasing.

In this case, a thermoelectric element has a problem that a dielectric breakdown occurs between an electrode and a substrate.

DISCLOSURE

Technical Problem

The present invention is directed to providing a structure of an electrode of a thermoelectric element for improving reliability.

Technical Solution

One aspect of the present invention provides a thermoelectric element including a first insulating part, a plurality of first electrodes disposed on the first insulating part, second electrodes disposed above the first electrodes, a first conductive semiconductor structure and a second conductive semiconductor structure which are disposed apart from each other between the first electrodes and the second electrodes, and a second insulating part disposed on the second electrodes, wherein the first insulating part includes a first protruding part protruding toward the first electrodes, and the second insulating part includes a second protruding part protruding toward the second electrodes.

The first protruding part and the second protruding part may overlap in a vertical direction.

The first protruding part and the second protruding part may have the same shape based on the first conductive semiconductor structure and the second conductive semiconductor structure.

The first protruding part and the second protruding part may have different shapes based on the first conductive semiconductor structure and the second conductive semiconductor structure.

The first protruding part and the second protruding part may be disposed apart from each other in a vertical direction.

A height of the first protruding part may be less than or equal to 0.5 times a thickness of the first electrode.

A height of the first protruding part may be greater than or equal to 0.5 times a thickness of the first electrode.

Each of the first electrode and the second electrode may include a groove portion disposed at an edge of a surface facing a substrate adjacent thereto, and the groove portion may have a closed-loop when viewed from above.

Each of the first protruding part and the second protruding part may be disposed in the groove portion.

Each of the first electrode and the second electrode may further include a protruding electrode disposed at an edge of a lower surface of the groove portion, and a height of the protruding part in a vertical direction may be less than or equal to a height of the groove portion in the vertical direction.

Advantageous Effects

According to embodiments of the present invention, a thermoelectric element with high electrical reliability can be obtained.

Specifically, according to embodiments of the present invention, a thermoelectric element including a groove, which is formed along an edge of one surface disposed toward a substrate adjacent to an electrode, can be provided.

In addition, the thermoelectric element according to embodiments of the present invention can be applied to not only applications implemented in small types but also applications implemented in large types such as vehicles, ships, steel mills, and incinerators.

DESCRIPTION OF DRAWINGS

FIG. 1 is a perspective view illustrating a thermoelectric element according to one embodiment of the present invention.

FIG. 2 is a cross-sectional view illustrating the thermoelectric element according to one embodiment of the present invention.

FIG. 3 is a perspective view illustrating an electrode according to a first embodiment of the present invention.

FIG. 4 is a top view illustrating the electrode according to the first embodiment of the present invention.

FIG. 5 is a side view illustrating the electrode according to the first embodiment of the present invention.

FIG. 6 is a bottom view illustrating the electrode according to the first embodiment of the present invention.

FIG. 7 is a perspective view illustrating the electrode and a first protruding part according to the first embodiment of the present invention.

FIG. 8 is a cross-sectional view illustrating the electrode and the first protruding part according to the first embodiment of the present invention.

FIG. 9 is a cross-sectional view illustrating a thermoelectric element according to a second embodiment of the present invention.

FIG. 10 is an enlarged view illustrating portion K1 of FIG. 9.

FIG. 11 is a view illustrating a modified embodiment of FIG. 10.

FIG. 12 is a cross-sectional view illustrating a thermoelectric element according to a third embodiment of the present invention.

FIG. 13 is an enlarged view illustrating portion K2 of FIG. 12.

FIG. 14 is a view illustrating a modified embodiment of FIG. 13.

FIG. 15 is a side view illustrating an electrode and a first protruding part according to another modified embodiment.

FIGS. 16A to 16E are views for describing a method of manufacturing the electrode according to the first embodiment.

MODES OF THE INVENTION

Hereinafter, exemplary embodiments of the present invention will be described in detail with reference to the accompanying drawings.

However, the technical spirit of the present invention is not limited to some embodiments which will be described and may be realized using various other embodiments, and at least one component of the embodiments may be selectively coupled, substituted, and used within the range of the technical spirit of the present invention.

In addition, unless clearly and specifically defined otherwise by context, all terms (including technical and scientific terms) used herein can be interpreted as having meanings customarily understood by those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless specifically indicated otherwise by the context, singular forms may include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, when an element is referred to as being "connected" or "coupled" to another element, such a description may include not only a case in which the element is directly connected or coupled to another element but also a case in which the element is connected or coupled to another element with still another element disposed therebetween.

In addition, in a case in which any one element is described as being formed or disposed "on" or "under" another element, such a description includes not only a case in which the two elements are formed or disposed in direct contact with each other but also a case in which one or more other elements are formed or disposed between the two elements. In addition, when one element is described as being disposed "on or under" another element, such a description may include a case in which the one element is disposed at an upper side or lower side with respect to another element.

FIG. 1 is a perspective view illustrating a thermoelectric element according to one embodiment of the present invention, and FIG. 2 is a cross-sectional view illustrating the thermoelectric element according to one embodiment of the present invention.

Referring to FIGS. 1 and 2, a thermoelectric element 100 includes a lower substrate 110, lower electrodes 120, second conductive semiconductor structures 130, first conductive semiconductor structures 140, upper electrodes 150, and an upper substrate 160.

The lower electrodes 120 are disposed between the lower substrate 110 and lower surfaces of the second conductive semiconductor structures 130 and the first conductive semiconductor structures 140, and the upper electrodes 150 are disposed between the upper substrate 160 and upper surfaces of the second conductive semiconductor structures 130 and the first conductive semiconductor structures 140. Accordingly, the plurality of second conductive semiconductor structures 130 and the plurality of first conductive semiconductor structures 140 are electrically connected through the lower electrodes 120 and the upper electrodes 150. A pair of the second conductive semiconductor structure 130 and the first conductive semiconductor structure 140 that are disposed between and electrically connected to the lower electrodes 120 and the upper electrode 150 may form a unit cell. The lower electrode 120 may be interchangeably used with a "first electrode" in the specification. In addition, the lower electrode 120 may be interchangeably used with a "second electrode" in the specification. In addition, electrodes have meanings including all the upper electrodes and the lower electrodes. In addition, the lower substrate may be interchangeably used with a "first substrate" and the upper substrate may be interchangeably used with a "second substrate." In addition, in the present specification, a first direction (X-axis direction) may include a direction X1 from the first substrate toward the second substrate and a direction X2 opposite to the direction X1 and may be used as a "vertical direction." In addition, the first electrode and the second electrode may be provided as the plurality of first electrodes and the plurality of second electrodes.

As an example, when a voltage is applied to the lower electrodes 120 and the upper electrodes 150 through lead wires 181 and 182, due to the Peltier effect, the substrate through which a current flows from the second conductive semiconductor structure 130 to the first conductive semiconductor structure 140 may absorb heat to serve as a cooling portion, and the substrate through which a current flows from the first conductive semiconductor structure 140 to the second conductive semiconductor structure 130 may be heated to serve as a heating portion. Alternatively, when different temperatures are applied to the lower electrode 120 and the upper electrode 150, due to the Seebeck effect, electric charges may move through the second conductive semiconductor structure 130 and the first conductive semiconductor structure 140 so that electricity may also be generated.

In this case, each of the second conductive semiconductor structure 130 and the first conductive semiconductor structure 140 may be a bismuth-telluride (Bi—Te)-based thermoelectric leg mainly including Bi and Te. The second conductive semiconductor structure 130 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). As an example, the second conductive semiconductor structure 130 may include Bi—Sb—Te at 99 to 99.999 wt % as a main material and at least one material among Ni, Al, Cu, Ag, Pb, B, Ga, and In at 0.001 to 1 wt % based on a total weight of 100 wt %. The first conductive semiconductor structure 140 may be a Bi—Te-based thermoelectric leg including at least one among Se, Ni, Al, Cu, Ag, Pb, B, Ga, Te, Bi, and In. As an example, the first conductive semiconductor structure 140 may include Bi—Se—Te at 99 to 99.999 wt % as a main material and at least one material among Ni, Al, Cu, Ag, Pb, B, Ga, and In at 0.001 to 1 wt % based on a total weight of 100 wt %.

Each of the second conductive semiconductor structure 130 and the first conductive semiconductor structure 140 may be formed in a bulk type or stack type. Generally, the bulk type second conductive semiconductor structure 130 or the bulk type first conductive semiconductor structure 140 may be formed through a process in which a thermoelectric material is thermally treated to manufacture an ingot, the ingot is ground and strained to obtain a powder for a thermoelectric leg, the powder is sintered, and the sintered powder is cut. In this case, each of the second conductive semiconductor structure 130 and the first conductive semiconductor structure 140 may be a polycrystalline thermoelectric leg. As described above, when each of the second conductive semiconductor structure 130 and the first conductive semiconductor structure 140 is the polycrystalline thermoelectric leg, the strength of each of the second conductive semiconductor structure 130 and the first conductive semiconductor structure 140 may increase. The stacked second conductive semiconductor structure 130 or the stacked first conductive semiconductor structure 140 may be formed in a process in which a paste containing a thermoelectric material is applied on base members each having a sheet shape to form unit members, and the unit members are stacked and cut.

In this case, the second conductive semiconductor structure 130 and the first conductive semiconductor structure 140 provided in a pair may have the same shape and volume or may have different shapes and volumes. As an example, since electrical conduction properties of the second conductive semiconductor structure 130 and the first conductive semiconductor structure 140 are different, a height or cross-sectional area of the first conductive semiconductor structure 140 may be different from that of the second conductive semiconductor structure 130.

In this case, the second conductive semiconductor structure 130 or the first conductive semiconductor structure 140 may have a cylindrical shape, a polygonal column shape, an elliptical column shape, or the like.

The performance of a thermoelectric element according to one embodiment of the present invention may be expressed as a thermoelectric performance figure of merit (ZT). The thermoelectric performance figure of merit (ZT) may be expressed by Equation 1.

$$ZT = \alpha^2 \cdot \sigma \cdot T/K \quad \text{[Equation 1]}$$

Here, $\alpha$ denotes the Seebeck coefficient [V/K], $\sigma$ denotes electrical conductivity [S/m], and $\alpha^2 \cdot \sigma$ denotes a power factor [W/mK$^2$]. In addition, T denotes temperature, and k denotes thermal conductivity [W/mK]. k may be expressed as $a \cdot cp \cdot \rho$, wherein a denotes thermal diffusivity [cm$^2$/S], cp denotes specific heat [J/gK], and $\rho$ denotes density [g/cm$^3$].

In order to obtain the thermoelectric performance figure of merit (ZT) of a thermoelectric element, a Z value (V/K) is measured using a Z meter, and the thermoelectric performance figure of merit (ZT) may be calculated using the measured Z value.

In this case, each of the lower electrodes 120 disposed between the lower substrate 110 and the second conductive semiconductor structures 130 and the first conductive semiconductor structures 140 and the upper electrodes 150 disposed between the upper substrate 160 and the second conductive semiconductor structures 130 and the first conductive semiconductor structures 140 may include at least one among Cu, Ag, Al, and Ni and may have a thickness of 0.01 mm to 0.3 mm. When the thickness of the lower electrode 120 or the upper electrode 150 is less than 0.01 mm, an electrode function is degraded, and thus the electrical conductivity performance may be degraded, and when the thickness is greater than 0.3 mm, a resistance increases, and thus a conduction efficiency can be lowered.

In addition, the lower substrate 110 and the upper substrate 160, which are opposite to each other, may be metal substrates, and a thickness of each of the lower substrate 110 and the upper substrate 160 may be in the range of 0.1 mm to 1.5 mm. When a thickness of the metal substrate is less than 0.1 mm or greater than 1.5 mm, since a heat radiation property or thermal conductivity may become excessively high, reliability of the thermoelectric element may be degraded.

In addition, when the lower substrate 110 and the upper substrate 160 are the metal substrates, a first insulating part 170a and a second insulating part 170b may be further formed between the lower substrate 110 and the lower electrode 120 and between the upper substrate 160 and the upper electrode 150.

Accordingly, the thermoelectric element 100 according to the embodiment may further include insulating parts 170 including the first insulating part 170a and the second insulating part 170b.

First, each of the first insulating part 170a and the second insulating part 170b may include materials having a thermal conductivity of 1 to 20 W/mK. In this case, each of the first insulating part 170a and the second insulating part 170b may be a resin composition including at least one of an epoxy resin and a silicon resin and an inorganic material, a layer formed of a silicon composite including silicon and an inorganic material, or an aluminum oxide layer. In this case, the inorganic material may be at least one among an oxide, a carbide, and a nitride containing aluminum, boron, silicon, or the like.

In addition, the insulating part 170 may be disposed between the adjacent lower electrodes 120 or the adjacent upper electrodes 150 and positioned closer to the second conductive semiconductor structure 130 or the first conductive semiconductor structure 140 than a protruding part 180 which will be described below. For example, a length of the insulating part 170 in the first direction (X-axis direction) may be greater than a length of the protruding part 180 in the first direction.

In addition, the insulating part 170 may be convex toward the adjacent substrate between the adjacent lower electrodes 120 or the adjacent upper electrodes 150. For example, an upper surface of the first insulating part 170a may be positioned above an upper surface of the first protruding part 180a and may be convex toward the lower substrate 110 between the adjacent lower electrodes 120. Alternatively, the upper surface of the first insulating part 170a may be concave toward the upper substrate 160. Such contents may be equally applied to various embodiments which will be descried below.

In this case, sizes of the lower substrate 110 and the upper substrate 160 may also be different. That is, a volume, a thickness, or an area of one of the lower substrate 110 and the upper substrate 160 may be greater than a volume, a thickness, or an area of the other. In this case, the thickness may be a thickness in a direction from the lower substrate 110 toward the upper substrate 160, and the area may be an area in a direction perpendicular to the direction from the substrate 110 toward the upper substrate 160. Accordingly, the heat absorption or radiation performance of the thermoelectric element can be improved. Preferably, at least one of the volume, the thickness, and the area of the lower substrate 110 may be greater than that of the upper substrate 160. In this case, when the lower substrate 110 is disposed in a high-temperature region for the Seebeck effect or applied as a heating region for the Peltier effect, or a sealing member for protecting the thermoelectric element, which will be described below, from an external environment is disposed on the lower substrate 110, at least one of the volume, the thickness, and the area of the lower substrate 110 may be greater than that of the upper substrate 160. In this case, the area of the lower substrate 110 may be formed in the range of 1.2 to 5 times the area of the upper substrate 160. When the area of the lower substrate 110 is smaller than 1.2 times the area of the upper substrate 160, an effect of an increase in heat transfer efficiency may not be large, and when the area of the lower substrate 110 is greater than 5 times the area of the upper substrate 160, a heat transfer efficiency may rather be remarkably reduced, and a basic shape of the thermoelectric apparatus may not be maintained.

In addition, a heat radiation pattern, for example, an uneven pattern, may be formed on a surface of at least one of the lower substrate 110 and the upper substrate 160. Accordingly, the heat radiation performance of the thermoelectric element can be improved. When the uneven pattern is formed on a surface in contact with the second conductive semiconductor structure 130 or the first conductive semiconductor structure 140, a bonding property between the thermoelectric leg and the substrate can be improved. The thermoelectric element 100 includes the lower substrate 110, the lower electrodes 120, the second conductive semiconductor structures 130, the first conductive semiconductor structures 140, the upper electrodes 150, and the upper substrate 160.

Although not illustrated in the drawings, the sealing member may also be further disposed between the lower substrate 110 and the upper substrate 160. The sealing member may be disposed on side surfaces of the lower electrodes 120, the second conductive semiconductor structures 130, the first conductive semiconductor structures 140, and the upper electrodes 150 between the lower substrate 110 and the upper substrate 160. Accordingly, the lower electrodes 120, the second conductive semiconductor structures 130, the first conductive semiconductor structures 140, and the upper electrodes 150 can be sealed from external moisture, heat, contamination, or the like.

In addition, in the thermoelectric element according to the embodiment, the first insulating part 170a and the second insulating part 170b may further include a first protruding part 180a and a second protruding part 180b. The first protruding part 180a and the second protruding part 180b may be disposed in groove portions, which will be described below, of the lower electrode 120 and the upper electrode 150. For example, the first protruding part 180a and the second protruding part 180b may include the first protruding part 180a disposed in the groove portion of the lower electrode 120 and the second protruding part 180b disposed in the groove portion of the upper electrode 150. Due to such a configuration, a problem, that the lower electrode 120 and the upper electrode 150 pass through the first insulating part 170a and the second insulating part 170b to cause dielectric breakdown so as to be electrically connected to the lower substrate 110 and the upper substrate 160, can be prevented. This will be described below. In the present specification, the first protruding part 180a will be mainly described, this will be equally applied to the second protruding part 180b, and the insulating parts 170 may include or not include the first protruding part 180a and the second protruding part 180b as elements. That is, the first insulating part 170a may be formed of a material different from a material of the first protruding part 180a. Alternatively, the first insulating part 170a may be formed of a material which is the same as a material of the first protruding part 180a. Accordingly, it should be understood that the first insulating part 170a may have or may not have a boundary surface between the first insulating part 170a and the first protruding part 180a. Accordingly, the protruding part will be described as an element which is included in the insulating part or described as an element different from the insulating part.

FIG. 3 is a perspective view illustrating an electrode according to a first embodiment of the present invention, FIG. 4 is a top view illustrating the electrode according to the first embodiment of the present invention, FIG. 5 is a side view illustrating the electrode according to the first embodiment of the present invention, and FIG. 6 is a bottom view illustrating the electrode according to the first embodiment of the present invention.

Referring to FIGS. 3 to 6, an electrode 120 or 150 according to the first embodiment includes the first electrode 120 or the second electrode 150, and the first electrode 120 will be mainly described below.

The first electrode 120 may include a first surface S1, a second surface S2, and a third surface S3.

The first surface 51 may be a surface disposed at a side of a substrate (for example, a lower substrate 110) adjacent to the first electrode 120. At least a part of the first surface 51 may be in contact with the adjacent substrate 110 or a first insulating part 170a (see FIG. 2) on the substrate 110. The first surface 51 may have a rectangular shape but also may have a polygonal or circular shape.

In addition, the first surface 51 may include a first edge portion E1, a second edge portion E2, a third edge portion E3, and a fourth edge portion E4 which are outermost portions.

The first edge portion E1 may be disposed to face the second edge portion E2. In addition, the third edge portion E3 may be disposed to face the fourth edge portion E4. In addition, the third edge portion E3 and the fourth edge portion E4 may be disposed between the first edge portion E1 and the second edge portion E2.

In addition, lengths of the first edge portion E1 and the second edge portion E2 in a second direction (Y-axis direction) may be different from lengths of the third edge portion E3 and the fourth edge portion E4 in a third direction (Z-axis direction). In this case, the second direction (Y-axis direction) and the third direction (Z-axis direction) are two perpendicular directions on a plane perpendicular to a first direction (X-axis direction).

As an example, the lengths of the first edge portion E1 and the second edge portion E2 in the second direction (Y-axis direction) may be smaller than the lengths of the third edge portion E3 and the fourth edge portion E4 in the third direction (Z-axis direction).

In addition, a groove portion G1 may be disposed along an edge of the first surface S1. That is, the first surface S1 may include the groove portion G1. In other words, the first surface S1 may have a shape having a protruding structure extending from a central portion toward the adjacent substrate (for example, the lower substrate). In the present specification, the first electrode 120 and the second electrode 150 includes the groove portion G1 and a groove portion G2, but, as described above, the first electrode 120 and the groove portion G1 disposed in the first electrode 120 will be mainly described.

The groove portion G1 may extend along the edge of the first surface S1 and has a closed-loop on a plane YZ. Accordingly, the groove portion G1 may be disposed to surround the protruding structure positioned at the central portion of the first surface S1.

On the first surface S1, the first edge portion E1 to the fourth edge portion E4 may be disposed apart from the central portion of the first surface S1 in the first direction. That is, a lower surface GS1a of the groove portion G1 and a central surface S1a of the first surface S1 may be disposed apart from each other. Accordingly, the first surface S1 may have a height difference due to the groove portion G1, and the height difference may correspond to a height H2 of the groove portion G1 in the first direction.

According to the embodiment, a ratio of the height H2 of the groove portion G1 to a height H1 of the first electrode 120 may be in the range of 1:1.8 to 1:3.2. When the ratio is less than 1:1.8, there is a problem that an electric resistance of the electrode increases to degrade the performance of the thermoelectric element. In addition, when the ratio is greater than 1:3.2, there is a problem that a first protruding part 180a seated in the groove portion is separated from the electrode. In addition, there may be a problem that the first protruding part formed in the groove portion passes through the first insulating part 170a to cause dielectric breakdown on the first insulating part 170a.

In addition, the first surface S1 may include the lower surface GS1a and a side surface GS2a of the groove portion G1 and the central surface S1a.

In addition, according to the embodiment, a ratio of a width W1 of the groove portion G1 to a width W2 of the first electrode 120 may be in the range of 1:20 to 1:54.2. When the ratio is smaller than 1:20, there is a problem of degrading mechanical reliability between the electrode and the protruding part. In addition, when the ratio is greater than 1:54.2, there is a problem of increasing an electrical resistance of the electrode.

The second surface S2 may be disposed to face the first surface S1. In addition, the second surface S1 may be a surface disposed on a thermoelectric leg electrically connected to the first electrode 120. At least a part of the second surface S2 may be in contact with or electrically connected to a second conductive semiconductor structure or first conductive semiconductor structure.

The third surface S3 may be disposed between the first surface S1 and the second surface S2. When the first surface S1 and the second surface S2 are a lower surface and an upper surface of the first electrode 120, the third surface S3 may correspond to a side surface of the first electrode 120.

FIG. 7 is a perspective view illustrating the electrode and the first protruding part according to the first embodiment of the present invention, and FIG. 8 is a cross-sectional view illustrating the electrode and the first protruding part according to the first embodiment of the present invention.

Referring to FIGS. 7 and 8, the first protruding part 180a may be disposed in the groove portion G1 of the first electrode 120. In this case, the first protruding part 180a may have a shape corresponding to a shape of the groove portion G1. That is, each of surfaces of the first protruding part 180a may be coplanar with one of the first surface S1 and the third surface S3.

In addition, the first protruding part 180a and the first electrode 120 may be in contact with the first insulating part 170a disposed under the first protruding part 180a and the first electrode 120 as described above. In addition, the first protruding part 180a and the first electrode 120 may be coupled to the lower substrate through the first insulating part 170a.

In addition, according to the embodiment, the first electrode 120 includes the groove portion G1 at an edge, the first protruding part 180a is seated in the groove portion G1, and thus a protruding electrode protruding from the first electrode (or the first surface) toward the lower substrate may not be formed. That is, the first protruding part 180a can prevent the protruding electrode from being formed. Accordingly, since damage to the first insulating part 170a due to the protruding part does not occur, electrical connection between the first electrode and the lower substrate (or between the second electrode and the upper substrate) due to a dielectric breakdown of the insulating part 170a (or the second insulating part 170b) can be prevented. That is, electrical reliability of the thermoelectric element can be improved.

FIG. 9 is a cross-sectional view illustrating a thermoelectric element according to a second embodiment of the present invention, and FIG. 10 is an enlarged view illustrating portion K1 of FIG. 9.

Referring to FIGS. 9 to 10, the thermoelectric element according to the second embodiment may include a lower substrate 110, lower electrodes 120, second conductive semiconductor structures 130, first conductive semiconductor structures 140, upper electrodes 150, an upper substrate 160, a first insulating part 170a, and a second insulating part 170b as described above. The above-described contents may be equally applied except contents which will be described below.

According to the thermoelectric element according to the second embodiment, each of the first electrodes 120 may include a protruding electrode PR protruding toward the adjacent substrate at an outermost side of a first surface S1.

First, protruding electrodes PR may include a first protruding electrode PR1a of the first electrode 120 and a second protruding electrode PR1b of the second electrode 150, and hereinafter, each of the first protruding electrode PR1a and the second protruding electrode PR1b will be described as the protruding electrode PR.

The protruding electrode PR may be disposed on a lower surface GS1a of a groove portion G1. In addition, the protruding electrode PR may be disposed at an outermost side, that is, an edge, of the lower surface GS1a of the groove portion G1. In addition, the protruding electrode PR may have a closed-loop on a plane YZ perpendicular to a first direction like the groove portion G1. Alternatively, the protruding electrode PR may have an open-loop on the plane YZ perpendicular to the first direction.

A height H3 of the protruding electrode PR in the first direction may be smaller than or equal to a height H2 of the groove portion G1. Due to such a configuration, the protruding electrode PR may not pass through the first insulating part 170a or at least a partial region. Accordingly, not only mechanical reliability of the first insulating part 170a is improved, but degradation of electrical reliability of the thermoelectric element due to a dielectric breakdown of the first insulating part 170a can also be prevented.

In addition, the first insulating part 170a may be in contact with the first electrode 120 and the lower substrate 110 and may couple the first electrode 120 and the lower substrate. In this case, the first insulating part 170a may extend into the groove portion G1 in a bonding region OR in which the first insulating part 170a overlaps the first electrode 120. That is, the first insulating part 170a may further include a first protruding part 180a protruding along an edge of an adjacent electrode (for example, the first electrode) in the bonding region OR. The first protruding part 180a may overlap the groove portion G1 in the first direction. Shapes of the first protruding part 180a and a second protruding part 180b in the drawings may be different from shapes of the first protruding part 180a and the second protruding part 180b in other drawings due to the protruding electrode or the like, and this will be described below.

In addition, the first protruding part 180a may be in contact with both the lower surface GS1a and a side surface GS2a of the groove portion G1. Accordingly, a coupling force between the first protruding part 180a and the first electrode 120 can be improved, and the first protruding part 180a can easily support the first electrode 120. Accordingly, reliability of the thermoelectric element according to the embodiment can be improved. The description according to the present embodiment may also be equally applied to the second protruding part and the second insulating part.

FIG. 11 is a view illustrating a modified embodiment of FIG. 10.

Referring to FIG. 11, a thermoelectric element according to the modified embodiment may include a lower substrate 110, lower electrodes 120, second conductive semiconductor structures 130, first conductive semiconductor structures 140, upper electrodes 150, an upper substrate 160, a first insulating part 170a, and a second insulating part 170b as described above. The above-described contents may be equally applied except contents which will be described below.

According to the modified embodiment, each of the first electrodes 120 may include a protruding electrode PR protruding toward the adjacent substrate at an outer most side of a first surface S1. The above-described contents may be equally applied to the protruding electrode PR.

The protruding electrode PR may be disposed on a lower surface GS1a of a groove portion G1. In addition, the protruding electrode PR may be disposed on at an outermost side, that is, an edge, of the lower surface GS1a of the groove portion G1. In addition, the protruding electrode PR may have a closed-loop on a plane YZ perpendicular to a first direction like the groove portion G1. Alternatively, the protruding electrode PR may have an open-loop on the plane YZ perpendicular to the first direction.

A height H3 of the protruding electrode PR in the first direction may be smaller than or equal to a height H2 of the groove portion G1. Due to such a configuration, the protruding electrode PR may not pass through the first insulating part 170a or at least a partial region. Accordingly, not only mechanical reliability of the first insulating part 170a is improved, but degradation of electrical reliability of the thermoelectric element due to a dielectric breakdown of the first insulating part 170a can also be prevented.

In addition, according to the modified embodiment, the first insulating part 170a may be in contact with the first electrode 120 and the lower substrate 110 and may couple the first electrode 120 and the lower substrate 110. In this case, the first insulating part 170a may extend into the groove portion G1 in a bonding region OR in which the first insulating part 170a overlaps the first electrode 120. The same contents may be applied to the second insulating part 170b and the second electrode 150.

In this case, the first insulating part 170a may include a first protruding part 180a protruding along an edge of the adjacent electrode (for example, the first electrode) in the bonding region OR. According to the modified embodiment, the first protruding part 180a overlaps the groove portion G1 in the first direction but may be disposed apart from the lower surface GS1a of the groove portion G1 in the first direction. A height H4 of the first protruding part 180a may be smaller than a height H2 of the groove portion G1.

In addition, at least a part of the first protruding part 180a may be in contact with a side surface GS2a of the groove portion G1. Even when the first insulating part 170a is coupled to the lower substrate and the first electrode 120 due to heat and a pressure between the lower substrate and the first electrode 120, the first insulating part 170a may not extend into the entire groove portion G1 due to a thickness of the insulating part 170a or the like. Due to such a configuration, an air gap may be present between the first protruding part 180a and the lower surface GS2a in the groove portion G1. The air gap may also have a closed-loop along the groove portion G1 when viewed from above. Accordingly, a distance for electrical connection between the first electrode and the lower substrate in a predetermined region increases, and thus electrical reliability of the first electrode can be improved.

In addition, due to the first protruding part 180a and a second protruding part 180b, contact areas between the first insulating part 170a and the second insulating part 170b and the electrodes 120 and 150 may increase to improve a coupling force. Accordingly, reliability of the thermoelectric element can be improved.

The above-described description may also be equally applied to the second protruding part and the second insulating part.

FIG. 12 is a cross-sectional view illustrating a thermoelectric element according to a third embodiment of the present invention, and FIG. 13 is an enlarged view illustrating portion K2 of FIG. 12.

The thermoelectric element according to the third embodiment may include a lower substrate 110, lower electrodes 120, second conductive semiconductor structures 130, first conductive semiconductor structures 140, upper electrodes 150, an upper substrate 160, a first insulating part 170a, and a second insulating part 170b as described above. The above-described contents may be equally applied except contents which will be described below.

According to the thermoelectric element according to the third embodiment, each of the first electrodes 120 may include a protruding electrode PR protruding toward the adjacent substrate at an outermost side of a first surface S1. First, protruding electrodes PR may include a first protruding electrode PR1a of the first electrode 120 and a second protruding electrode PR1b of the second electrode 150, and hereinafter, each of the first protruding electrode PR1a and the second protruding electrode PR1b will be described as the protruding electrode PR.

The protruding electrode PR may be disposed on a lower surface GS1a of a groove portion G1. In addition, the protruding electrode PR may be disposed at an outermost side, that is, an edge, of the lower surface GS1a of the groove portion G1. In addition, the protruding electrode PR may have a closed-loop on a plane YZ perpendicular to a first direction like the groove portion G1. Alternatively, the protruding electrode PR may have an open-loop on the plane YZ perpendicular to the first direction.

According to the third embodiment, a height H5 of the protruding electrode PR in the first direction may be greater than a height H2 of the groove portion G1. However, a height difference between the height H5 of the protruding electrode PR in the first direction and the height H2 of the groove portion G1 may be smaller than a thickness H6 of the first insulating part 170a. Due to such a configuration, even when the protruding electrode PR passes through a partial region of the first insulating part 170a, the protruding electrode PR may not pass through the entire first insulating part 170a. Accordingly, electrical reliability of the thermoelectric element due to breakage of the first insulating part 170a can also be prevented.

The first insulating part 170a may be in contact with the first electrode 120 and the lower substrate 110 and may couple the first electrode 120 and the lower substrate 110. In this case, the first insulating part 170a may extend into the groove portion G1 in a bonding region OR in which the first insulating part 170a overlaps the first electrode 120. That is, the first insulating part 170a may further include a first protruding part 180a protruding along an edge of the adjacent electrode (for example, the first electrode) in the bonding region OR. The first protruding part 180a may overlap the groove portion G1 in the first direction.

According to the embodiment, the first protruding part 180a may be in contact with both the lower surface GS1a and a side surface GS2a of the groove portion G1. Accordingly, a coupling force between the first protruding part 180a and the first electrode 120 can be further improved, and the first protruding part 180a can easily support the first electrode 120. Accordingly, reliability of the thermoelectric element according to the embodiment can be improved.

FIG. 14 is a view illustrating a modified embodiment of FIG. 13.

A thermoelectric element according to the modified embodiment may include a lower substrate 110, lower electrodes 120, second conductive semiconductor structures 130, first conductive semiconductor structures 140, upper electrodes 150, an upper substrate 160, a first insulating part 170a, and a second insulating part 170b as described above. The above-described contents may be equally applied except contents which will be described below. In addition, the above-described contents may be equally applied to a protruding electrode PR, the first insulating part 170a, and the second insulating part 170b except contents which will be described below.

According to the modified embodiment, the first insulating part 170a may be in contact with the first electrode 120 and the lower substrate 110 and may couple the first electrode 120 and the lower substrate. In this case, the first insulating part 170a may extend into the groove portion G1 in a bonding region OR in which the first insulating part 170a overlaps the first electrode 120.

In this case, the first insulating part 170a may include a first protruding part 180a protruding along an edge of the adjacent electrode (for example, the first electrode) in the bonding region OR. According to the modified embodiment, the first protruding part 180a overlaps the groove portion G1 in a first direction, but may be disposed apart from a lower surface GS1a of the groove portion G1 in the first direction.

In addition, at least a part of the first protruding part 180a may be in contact with a side surface GS2a of the groove portion G1. Even when the first insulating part 170a is coupled to the lower substrate and the first electrode 120 due to heat and a pressure between the lower substrate and the first electrode 120, the first insulating part 170a may not extend into the entire groove portion G1 due to a thickness of the first insulating part 170a or the like. Due to such a configuration, an air gap may be present between the first protruding part and the lower surface GS2a in the groove portion G1. The air gap may also have a closed-loop along the groove portion G1 when viewed from above. Accordingly, a distance for electrical connection between the first electrode and the lower substrate in a predetermined region increases, and thus electrical reliability of the first electrode can be improved.

In addition, due to the first protruding part 180a, a contact area between the first insulating part 170a and the electrode 120 may increase to improve a coupling force. Accordingly, reliability of the thermoelectric element can be improved.

In addition, according to the various embodiments, the first protruding part 180a and a second protruding part 180b may overlap in a vertical direction (for example, an X-axis direction). Due to such a configuration, a supporting force due to the first protruding part 180a and the second protruding part 180b is applied to the same position in the vertical direction, and thus reliability of the thermoelectric element can be improved.

In addition, shapes of the first protruding part 180a and the second protruding part 180b may be the same. For example, the first protruding part 180a and the second protruding part 180b may be the same based on the first conductive semiconductor structure 140 and the second conductive semiconductor structure 130.

Accordingly, shapes of the groove portion of the first electrode 120 and a shape of the second electrode 150 may be the same. In addition, the shapes of the first protruding part 180a and the second protruding part 180b seated in the groove portions may also be the same. Accordingly, since a coupling force between the first electrode 120 and the first substrate 110 through the first insulating part 170a is similar to a coupling force between the second electrode 150 and the second substrate 160 through the second insulating part 170b, delamination occurring due to non-uniform coupling forces is reduced, and thus reliability can be improved.

In addition, shapes of the first protruding part 180a and the second protruding part 180b may be different from each other. For example, the shapes of the first protruding part 180a and the second protruding part 180b may be different from each other based on the first conductive semiconductor structure 140 and the second conductive semiconductor structure 130. Accordingly, the coupling forces of the first insulating part 170a and the second insulating part 170b according to a positional difference between the second electrode 150 and the first electrode 120 can be uniformly maintained. For example, the second electrode 150 and the first electrode 120 may partially overlap in the vertical direction. In addition, the first protruding part 180a and the second protruding part 180b may be disposed apart from each other in the vertical direction. Accordingly, the shapes of the first protruding part 180a and the second protruding part 180b may be different in a region in which the first electrode and the second electrode do not overlap in the vertical direction. Accordingly, a delamination problem occurring due to the non-uniformity can be reduced.

In addition, a height of the first protruding part 180a may be smaller than or equal to 0.5 times a thickness of the first electrode. Accordingly, occurrence of a crack of the first insulating layer 170*a* due to the protruding electrode of the first electrode can be minimized.

Alternatively, the height of the first protruding part 180*a* may be greater than or equal to 0.5 times the thickness of the first electrode. Due to such a configuration, a coupling force between the first protruding part 180*a* and the first electrode 120 can be improved.

FIG. 15 is a side view illustrating an electrode and a first protruding part according to another modified embodiment.

Referring to FIG. 15, in the electrode according to another modified embodiment, at least one of a lower surface GS1*a* and a side surface GS2*a* of a groove portion G1 may have a pattern. That is, any one or at least a partial region of the lower surface GS1*a* and the side surface GS2*a* of the groove portion G1 may have an uneven pattern. For example, a roughness of a surface of the groove portion G1 may be greater than a roughness of the other surface excluding the groove portion. Accordingly, the first protruding part 180*a* and the second protruding part 180*b* can be more easily coupled to the first electrode 120 to improve mechanical reliability.

FIGS. 16A to 16E are views for describing a method of manufacturing the electrode according to the first embodiment.

A method of manufacturing the electrode, the first protruding part, and the second protruding part according to the first embodiment includes an etching process of a substrate member, a coating process of first protruding parts and second protruding parts, a lapping process of the first protruding parts and the second protruding parts to a partial region, and a separating process for each electrode. Hereinafter, the first protruding part will be mainly described.

First, referring to FIGS. 16A and 16B, a part of a region excluding a region corresponding to a plurality of electrodes may be etched in a substrate member SB.

The substrate member SB may be formed of a material corresponding to a first electrode and a second electrode. Hereinafter, the first electrode and the second electrode will be described as an electrode.

In addition, a region excluding regions having sizes corresponding to the plurality of electrodes may be etched in the substrate member SB. Edge portions EP of the regions corresponding to the sizes of the plurality of electrodes disposed apart from each other may be etched in the substrate member SB in order for a manufacturing yield. In addition, widths d11 of the edge portions corresponding to the adjacent electrodes may be the same.

Referring to FIG. 16C, a first protruding part 180A may be applied on the etched substrate member SB. Accordingly, the first protruding part 180A may be positioned at an entire region corresponding to the plurality of electrodes. In this case, a material of the first protruding part 180A may be different from a material of an insulating part.

Referring to FIG. 16D, the first protruding part 180A on the substrate member SB may be lapped to a predetermined region. Due to the lapping, a region excluding the edge portions EP in the region corresponding to the plurality of electrodes may be exposed. However, a lapped first protruding part 180B may be positioned at the edge portions EP. Accordingly, the edge portions EP may not be exposed.

In addition, the substrate member SB may be separated into individual electrodes (for example, first electrodes and second electrodes) along the edge portions EP. That is, a dicing process may be performed. The dicing process may be performed along virtual lines SL1 and SL2 corresponding to a boundary line between the adjacent electrodes among the plurality of electrodes.

Referring to FIG. 16E, the substrate member may be divided into electrodes 120 and 150 through the dicing process. The electrodes 120 and 150 may have groove portions at edges through an etching process. The groove portions may correspond to the edge portions EP.

The thermoelectric element described in the present specification may be applied to a thermoelectric apparatus. The thermoelectric apparatus may include the thermoelectric element and a heat sink coupled to the thermoelectric element.

In addition, the thermoelectric apparatus can be used in a power generation apparatus or a power generation system including the power generation apparatus. For example, the power generation system may include the power generation apparatus and a fluid pipe, a fluid introduced into the fluid pipe may be a source for heat generated by an engine of a vehicle, vessel, or the like, a power plant, a steel mill, or the like. However, the present invention is not limited thereto. In addition, a temperature of the fluid discharged from the fluid pipe is lower than a temperature of the fluid introduced into the fluid pipe. For example, the temperature introduced into the fluid pipe may be higher than or equal to 100° C., preferably 200° C. or more, and more preferably in the range of 220° C. to 250° C. but is not limited thereto and may vary according to a temperature difference between a low-temperature part and a high-temperature part of the thermoelectric element. Accordingly, the thermoelectric element according the embodiment of the present invention can operate in a power generation apparatus, a cooling apparatus, a heating apparatus, or the like.

While the present invention has been described with reference to exemplary embodiments thereof, it will be understood by those skilled in the art that the present invention may be variously changed and modified without departing from the spirit and scope of the present invention defined by the appended claims below.

The invention claimed is:

1. A thermoelectric element comprising:
    a first insulating part;
    a plurality of first electrodes disposed on the first insulating part;
    a plurality of second electrodes disposed above the first electrodes;
    a first conductive semiconductor structure and a second conductive semiconductor structure which are disposed apart from each other between the first electrodes and the second electrodes; and
    a second insulating part disposed on the second electrodes,
    wherein the first insulating part includes a first protruding part protruding toward the first electrodes,
    wherein the second insulating part includes a second protruding part protruding toward the second electrodes,
    wherein each of the first electrode and the second electrode includes a groove portion disposed at an edge of a surface facing a substrate adjacent thereto and a protruding electrode disposed at an edge of a lower surface of the groove portion,
    wherein the groove portion has a closed-loop when viewed from above, and
    wherein a height of the protruding electrode in a vertical direction is less than or equal to a height of the groove portion in the vertical direction.

2. The thermoelectric element of claim 1, wherein the first protruding part and the second protruding part overlap in a vertical direction.

3. The thermoelectric element of claim 2, wherein the first protruding part and the second protruding part have the same shape based on the first conductive semiconductor structure and the second conductive semiconductor structure.

4. The thermoelectric element of claim 2, wherein the first protruding part and the second protruding part have different shapes based on the first conductive semiconductor structure and the second conductive semiconductor structure.

5. The thermoelectric element of claim 1, wherein the first protruding part and the second protruding part are disposed apart from each other in a vertical direction.

6. The thermoelectric element of claim 1, wherein a height of the first protruding part is less than or equal to 0.5 times a thickness of the first electrode.

7. The thermoelectric element of claim 1, wherein a height of the first protruding part is greater than or equal to 0.5 times a thickness of the first electrode.

8. The thermoelectric element of claim 1, wherein each of the first protruding part and the second protruding part is disposed in the groove portion.

\* \* \* \* \*